Aug. 13, 1968 H. E. SPOONER ET AL 3,396,461

PRINTED CIRCUIT BOARD AND METHOD OF MANUFACTURE THEREOF

Original Filed Dec. 4, 1962

1

3,396,461
PRINTED CIRCUIT BOARD AND METHOD OF MANUFACTURE THEREOF

Howard E. Spooner and Adolph G. Bergmann, Barrington, R.I., assignors to Engelhard Industries, Inc., Newark, N.J., a corporation of Delaware Continuation of abandoned application Ser. No. 242,323, Dec. 4, 1962. This application Nov. 18, 1964, Ser. No. 412,161
1 Claim. (Cl. 29—630)

ABSTRACT OF THE DISCLOSURE

The present invention relates to the method of cladding the terminals of a printed circuit board of the type composed of a dielectric material and having bonded on a surface thereof a plurality of electrical circuit elements terminating in an aligned group of substantially parallel laterally spaced terminals on an end portion of the board, comprising positioning a comb-like strip of electrically conductive material onto the terminals, the comb-like strip comprising an elongated backing member having a plurality of substantially parallel blades laterally spaced to coincide with the spacing of the terminals and extending from a longitudinal edge of the backing, aligning the blades to register with the terminals, securing the blades to the terminals, and thereafter removing the backing member.

Figures 1, 2, 3, 4, 5, 6, 7, 8, 9, 10, 11:
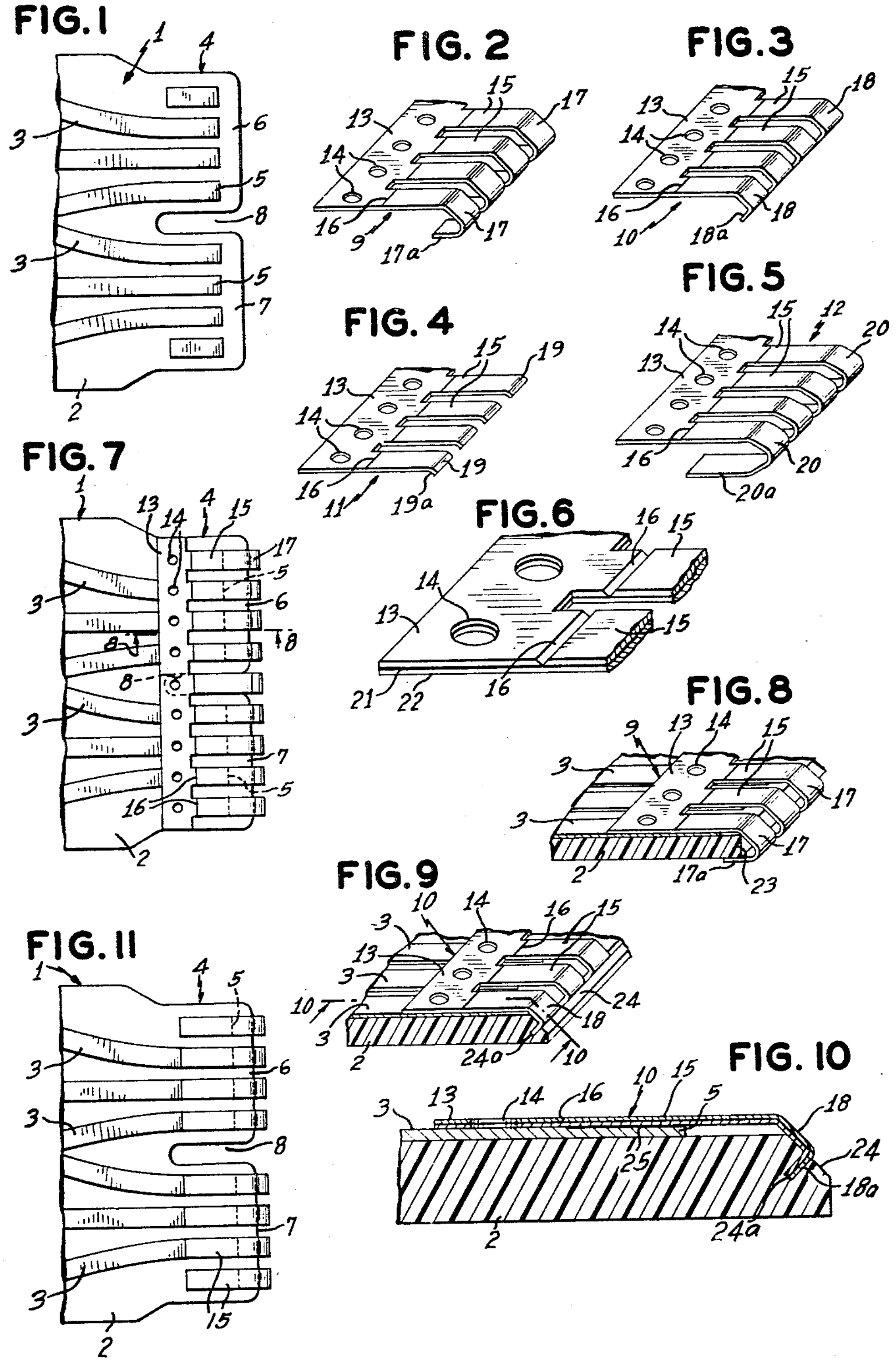

This application is a continuation of application Ser. No. 242,323, filed Dec. 4, 1962, now abandoned.

A printed circuit board of the plug-in type generally comprising a flat board composed of insulation or dielectric material on a surface of which is printed an electrical circuit including printed terminals usually converging and terminating as a parallel group at a comparatively narrow end portion of the board adapted for plugging into a connector receptacle. The printed circuit and terminals are conventionally composed of base metal, e.g., copper. The narrow portion of the board is inserted into a connector receptacle carrying internally thereof a group of base metal resilient connector terminals selectively complementary with the board terminals and for slidable pressurized contact therewith. Frequent connections of the board and the receptacle result in galling and excessive wear of the contact area unless the surfaces are suitably lubricated. The lubrication causes electrical creep or loss by partially shorting the contact area, and there is a pick-up and accumulation of debris which requires cleaning and re-lubrication. Otherwise, a high contact resistance develops due to accumulated contaminants and especially due to oxidation at the contact area.

The present invention overcomes the above-mentioned disadvantages by providing at least the terminals of the board with a suitably secured precious metal contact surface layer, e.g., a contact layer of gold or a metal of the platinum group, such as platinum or palladium, and shaped to insure slidable electrical contact with the connector with minimum insertion impedance to reduce wear, whereby, due to the composition of the contact layer and the shaping, necessity of lubrication is eliminated, and whereby low contact resistance and freedom from oxides is provided especially at the contact surface areas.

It is an object of the invention to provide the terminals of a plug-in type printed circuit board with means whereby the life of the printed circuit is prolonged.

It is another object of the invention to provide a method for the manufacture of a printed circuit board with board terminal surfaces resistant to oxidation.

It is a further object of the invention to provide a printed circuit board with composite terminals which are resistant to wear and which eliminate the need for lubrication thereof.

2

Other objects and advantages of the invention will become apparent from the description hereinafter following and the drawings forming a part hereof in which:

FIGURE 1 illustrates a top view of a portion of a conventional plug-in printed circuit board, FIGURE 2 is an isometric view of a portion of a component according to the invention, FIGURE 3 is an isometric view of a portion of a modified form of component, FIGURE 4 is an isometric view of a portion of another modified form of component, FIGURE 5 is an isometric view of a portion of still another modified form of component, FIGURE 6 is an enlarged fragmentary isometric view illustrating a preferred composite laminate as a component of the invention, FIGURE 7 is a top view of the combination according to the invention in an intermediate stage and showing the component illustrated by FIGURE 2 mounted on the printed circuit board of FIGURE 1, FIGURE 8 is an isometric fragmentary view along lines 8—8 of FIGURE 7, FIGURE 9 is an isometric fragmentary view of a modified combination of the invention showing the component illustrated by FIGURE 3 mounted on a modified printed circuit board, FIGURE 10 is an enlarged cross-sectional view along lines 10—10 of FIGURE 9, and FIGURE 11 is a top view of the completed structure in accordance with the invention.

Referring to the illustrations, FIGURE 1 shows a top view of a printed circuit board 1 comprising a substantially flat base 2 composed of a dielectric material, e.g., a synthetic resin or plastic, and having printed or bonded thereon, according to known procedure, a plurality of circuit elements 3 of copper or the like conductive base metal material. The circuit elements extend from the comparatively broad flat surface of the board into a terminal zone at the reduced or narrow end portion 4 where they terminate as printed parallel and laterally spaced terminals 5. It is such printed terminals that are especially deleteriously affected in use as hereinabove described. The narrow terminal zone 4 of the board is advantageously divided into a plurality, e.g., two, male insert members 6 and 7 by an elongated notch 8 parallel with the terminals 5, the insert members being insertable into a complementary divided female connector receptacle or the like, not shown. In order to protect the printed terminals and to thereby extend the life of the printed circuit boards, the printed terminals are advantageously clad with protective cladding members having a precious metal contact surface and shaped to insure slidable electrical contact with a connector with minimum insertion impedance. The cladding members are components of the combination herein contemplated and are initially provided, according to the method of the invention, in connected relationship in preformed shape as comb-like strips 9, 10, 11 and 12 as illustrated by FIGURES 2, 3, 4 and 5. The major portion of each of the strips are of identical form and comprise an elongated backing 13 with longitudinally spaced apertures 14 formed therethrough, and with blades 15 extending from a longitudinal edge of the backing and spaced from each other longitudinally of the backing 13. Each blade is scored or grooved or otherwise mechanically weakened by groove means, e.g., a score 16 across its width parallel to the backing 13 and substantially adjacent thereto. The common form features of each strip are clearly illustrated by FIGURE 6. The strips differ from each other in the configuration of the free end portions of the blades 15. The free end portions 17 of the blades of FIGURE 2 bend downwardly in a slope and then curve inwardly a short distance toward the backing 13 and terminate in an end 17*a* parallel with the blade body 15. The free end portions 18 of the blades of FIGURE 3 bend downwardly in a slope and then bend inwardly a short distance toward the backing and terminate in an end 18*a* at an acute angle with the blade body portion. The free end portions 19 of the blades of FIGURE 4 are either straight or curve downwardly very slightly into end 19*a*. The free end portions 20 of the blades of FIGURE 5 bend downwardly in a slope, then curve inwardly into another slope, and finally bend into end 20*a* parallel to the blade body and at a greater distance toward the backing 13 than does the free end portions of the blade of FIGURE 2.

FIGURE 6 illustrates the structure of the strips, in the preferred embodiment, as a composite laminate of a contact layer 21 of precious metal, e.g., gold, bonded to a base metal layer 22, e.g., a nickel-silver alloy.

FIGURES 7 and 8 illustrate the combination of the invention with the cladding strip 9 of FIGURE 2 secured to the board to overlay the printed terminals 5 in accordance with the method of the invention. Each of the spaced blades 15 is positioned parallel with a printed terminal 5 and is aligned to cover a correspondingly spaced printed terminal 5, with the free end portions 17 extending outwardly of the terminals 5 and embracing and overlying an end of the board portion 4. The blades 15 are bonded to each of the complementary terminals 5 by welding or soldering, for example, as shown by FIGURE 10 hereinafter more particularly described. Prior to bonding, the blades 15 may be properly positioned and aligned by gripping the strip at the apertures 14 and thereby aligning the blades as above described and also thereby longitudinally moving the blades relative to the terminals to cause the end portions 17 to embrace the end of the board. Having bonded the strip to the board, the backing 13 is bent and broken away from the blades by means of the score 16 thereby leaving the blades separately bonded to the printed terminals as illustrated by FIGURE 11.

The cladding component or strip 12 illustrated by FIGURE 5 is applied to the board in the manner described in connection with FIGURES 7 and 8.

The cladding strips 9 and 12 are advantageously employed when the leading end of the insertable portion of the board, e.g. narrow portion 4, terminates in a flat face 23 substantially perpendicular to the board, as illustrated by FIGURE 8.

However, the leading end of the narrow insertable portion 4 is advantageously chamfered or beveled at an upper end portion thereof to provide a chamfered or beveled slope 24, as illustrated by FIGURES 9 and 10.

The cladding strip 11 is applied to a board having a leading end either as shown by FIGURE 8 or as shown by FIGURES 9 and 10, with the ends 19*a* preferably extending slightly beyond the terminals 5.

Preferably the slope 24 is provided with a continuous elongated groove 24*a* normal to the terminals 5 and perpendicular with the face of slope 24. In such case, the strip 10, as illustrated by FIGURES 9 and 10, is bonded to the board with the end portions 18 extending outwardly beyond the ends of the terminals 5 and the ends 18*a* firmly anchored in groove 24*a*.

Prior to applying the strip 10 to the board, the terminals 5 are preferably at least partly coated with a solder layer 25 forwardly of the location of score 16 when the strip is mounted on the board. Having mounted the strip 10 over the soldered terminals in anchored position with respect to groove 24*a*, the blades are heated and pressurized to solder bond the blades to the terminals. The strip 11 is preferably solder bonded in similar manner. Having bonded strips 10 and 11, the backing 13 is removed as described in connection with strip 9 to provide separately bonded blades in a manner similar to that shown by FIGURE 11. It will be noted that since one of the blades 15 is positioned above slot 8 it has no terminal to be bonded to and is connected only to the backing 13 and therefore will normally be unbonded in position above slot 8, and such blade will be removed with the backing 13.

Various modifications of the invention are contemplated within the scope of the appended claim.

What is claimed is:

1. The method of cladding the terminals of a printed circuit board of the type composed of a dielectric material and having bonded on a surface thereof a plurality of electrical circuit elements terminating in an aligned group of substantially parallel laterally spaced terminals on an end portion of the board, comprising positioning a comb-like strip of electrically conductive material onto the terminals, the comb-like strip comprising an elongated backing member having a plurality of substantially parallel blades laterally spaced to coincide with the spacing of the terminals and extending from a longitudinal edge of the backing, aligning the blades to register with the terminals, positioning the registered blades with free ends thereof extending outwardly of the ends of the terminals, securing the blades to the terminals, and thereafter removing the backing member.

References Cited

UNITED STATES PATENTS

| | | | |
|---|---|---|---|
| 3,203,076 | 8/1965 | Emslie | 29—155.55 X |
| 3,153,840 | 10/1964 | Vincent. | |
| 3,054,172 | 9/1962 | Turney | 29—413 |
| 2,993,188 | 7/1961 | Anderson | 339—17 |
| 2,944,329 | 7/1960 | MacKay | 29—155.55 |
| 2,258,610 | 10/1941 | Hothersall | 29—413 |

CHARLIE T. MOON, *Primary Examiner.*

J. CLINE, *Assistant Examiner.*